(12) United States Patent
Chen et al.

(10) Patent No.: US 10,128,178 B2
(45) Date of Patent: Nov. 13, 2018

(54) ELECTRONIC PACKAGE AND METHOD FOR FABRICATING THE SAME

(71) Applicant: Siliconware Precision Industries Co., Ltd., Taichung (TW)

(72) Inventors: Lu-Yi Chen, Taichung (TW); Hung-Yuan Li, Taichung (TW); Chieh-Lung Lai, Taichung (TW); Shih-Liang Peng, Taichung (TW); Chang-Lun Lu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 146 days.

(21) Appl. No.: 15/258,441

(22) Filed: Sep. 7, 2016

(65) Prior Publication Data
US 2017/0338173 A1   Nov. 23, 2017

(30) Foreign Application Priority Data
May 18, 2016   (TW) ............................. 105115286 A

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4853* (2013.01); *H01L 21/4857* (2013.01); *H01L 21/561* (2013.01); *H01L 21/563* (2013.01); *H01L 23/3114* (2013.01); *H01L 23/3128* (2013.01); *H01L 23/49822* (2013.01); *H01L 23/49827* (2013.01); *H01L 25/0655* (2013.01); *H01L 25/50* (2013.01); *H01L 21/568* (2013.01); *H01L 23/49811* (2013.01); *H01L 24/13* (2013.01); *H01L 24/16* (2013.01); *H01L 24/48* (2013.01); *H01L 2224/131* (2013.01); *H01L 2224/16225* (2013.01); *H01L 2224/16235* (2013.01); *H01L 2224/16238* (2013.01); *H01L 2224/48227* (2013.01); *H01L 2224/97* (2013.01); *H01L 2924/15174* (2013.01); *H01L 2924/15192* (2013.01); *H01L 2924/15311* (2013.01); *H01L 2924/181* (2013.01);
(Continued)

(58) Field of Classification Search
CPC .......... H01L 23/49838; H01L 23/3114; H01L 23/3128; H01L 23/49822; H01L 25/0655
See application file for complete search history.

(56) References Cited

U.S. PATENT DOCUMENTS

2011/0089561 A1*   4/2011   Kurita .................. H01L 21/561
257/737

* cited by examiner

*Primary Examiner* — Marc Armand
(74) *Attorney, Agent, or Firm* — Mintz Levin Cohn Ferris Glovsky and Popeo, P.C.; Peter F. Corless; Steven M. Jensen

(57) ABSTRACT

An electronic package is provided, which includes: a circuit structure having opposite first and second surfaces; a metal layer formed on the first surface of the circuit structure; an electronic element disposed on the metal layer; an encapsulant encapsulating the electronic element; a plurality of conductive posts disposed on the second surface of the circuit structure; and an insulating layer encapsulating the conductive posts. The conductive posts of various sizes can be fabricated according to different aspect ratio requirements so as to make end products lighter, thinner, shorter and smaller. The disclosure further provides a method for fabricating the electronic package.

8 Claims, 5 Drawing Sheets

(51) Int. Cl.
*H01L 21/56* (2006.01)
*H01L 23/31* (2006.01)
*H01L 25/065* (2006.01)
*H01L 25/00* (2006.01)
*H01L 23/00* (2006.01)

(52) U.S. Cl.
CPC ............... *H01L 2924/18161* (2013.01); *H01L 2924/19041* (2013.01); *H01L 2924/19042* (2013.01); *H01L 2924/19043* (2013.01); *H01L 2924/19105* (2013.01); *H01L 2924/19106* (2013.01)

//pattern
ELECTRONIC PACKAGE AND METHOD FOR FABRICATING THE SAME

CROSS-REFERENCE TO RELATED APPLICATION

This application claims under 35 U.S.C. § 119(a) the benefit of Taiwanese Patent Application No. 105115286 filed May 18, 2016, the entire contents of which are incorporated herein by reference.

BACKGROUND OF THE DISCLOSURE

1. Technical Field

The present disclosure relates to electronic packages, and, more particularly, to an electronic package having a reduced size and a method for fabricating the same.

2. Description of Related Art

Along with the rapid development of electronic industries, electronic products are developed toward the trend of multi-function and high performance. Accordingly, there have been developed various types of flip-chip packaging modules, such as chip scale packages (CSP), direct chip attached (DCA) packages and multi-chip modules (MCM), and 3D IC chip stacking technologies.

FIG. 1 is a schematic cross-sectional view of a conventional 3D IC chip stacking-type semiconductor package 1. Referring to FIG. 1, a silicon interposer 10 is provided. The silicon interposer 10 has a chip mounting side 10a, an external connection side 10b opposite to the chip mounting side 10a and having a plurality of redistribution layers 101 formed thereon, and a plurality of through silicon vias (TSVs) 100 communicating the chip mounting side 10a and the external connection side 10b. A semiconductor chip 19 having a plurality of electrode pads 190 is disposed on the chip mounting side 10a of the silicon interposer 10, and the electrode pads 190 are electrically connected to the chip mounting side 10a of the silicon interposer 10 through a plurality of solder bumps 102. The electrode pads 190 have a small pitch therebetween. Further, an underfill 192 is formed between the semiconductor chip 19 and the chip mounting side 10a of the silicon interposer 10 for encapsulating the solder bumps 102. Furthermore, an encapsulant 18 is formed on the silicon interposer 10 to encapsulate the semiconductor chip 19. In addition, a packaging substrate 17 having a plurality of bonding pads 170 is disposed on the external connection side 10b of the silicon interposer 10, and the bonding pads 170 are electrically connected to the redistribution layers 101 through a plurality of conductive elements 103 such as bumps. The bonding pads 170 of the packaging substrate 17 have a large pitch therebetween. Also, an underfill 172 is formed to encapsulate the conductive elements 103.

To fabricate the semiconductor package 1, the semiconductor chip 19 is disposed on the silicon interposer 10 first, and then the silicon interposer 10 having the semiconductor chip 19 is disposed on the packaging substrate 17 through the conductive elements 103. Subsequently, the encapsulant 18 is formed, thereby obtaining the semiconductor packager 1.

In a subsequent application, the semiconductor package 1 is bonded to a circuit board (not shown) via a lower side of the packaging substrate 17, and the TSVs 100 serve as a signal transmission medium between the semiconductor chip 19 and the circuit board.

However, to achieve a suitable silicon interposer 10 for signal transmission between the semiconductor chip 19 and the packaging substrate 17, the TSVs 100 must be controlled to have a certain aspect ratio (100 um/10 um), which consumes a great amount of time and a lot of chemicals, and, therefore, complicates the fabrication process and incurs a high fabrication cost.

Further, the packaging substrate 17 has a core layer containing glass fiber. Consequently, the packaging substrate 17 is quite thick, which hinders miniaturization of the semiconductor package 1.

Furthermore, since the solder bumps 102 and the conductive elements 103 are already reflowed when being bonded to the silicon interposer 10, during formation of the encapsulant 18, the silicon interposer 10 likely warps due to a great temperature variation caused by multiple heating processes.

Therefore, how to overcome the above-described drawbacks has become critical.

SUMMARY OF THE DISCLOSURE

In view of the above-described drawbacks, the present disclosure provides an electronic package, which comprises: a circuit structure having a first surface provided with a first circuit layer and an opposite second surface provided with a second circuit layer; a metal layer formed on the first surface of the circuit structure and electrically connected to the first circuit layer; an electronic element disposed on the first surface of the circuit structure and electrically connected to the metal layer; an encapsulant formed on the first surface of the circuit structure and encapsulating the electronic element; a plurality of conductive posts disposed on the second surface of the circuit structure and electrically connected to the second circuit layer; and an insulating layer formed on the second surface of the circuit structure and encapsulating the conductive posts, wherein a portion of a surface of each of the conductive posts is exposed from the insulating layer.

The present disclosure further provides a method for fabricating an electronic package, which comprises the steps of: providing a circuit structure having a first surface provided with a first circuit layer and an opposite second surface provided with a second circuit layer; forming on the second surface of the circuit structure a plurality of conductive posts that are electrically connected to the second circuit layer; forming on the second surface of the circuit structure an insulating layer that encapsulates the conductive posts; forming on the first surface of the circuit structure a metal layer that is electrically connected to the first circuit layer; disposing on the first surface of the circuit structure an electronic element that is electrically connected to the metal layer; forming on the first surface of the circuit structure an encapsulant that encapsulates the electronic element; and removing a portion of the insulating layer to expose a portion of a surface of each of the conductive posts.

In an embodiment, the first circuit layer has a minimum trace width less than that of the second circuit layer.

In an embodiment, the metal layer is a patterned circuit layer.

In an embodiment, the encapsulant and the insulating layer are made of the same or different materials.

In an embodiment, the encapsulant extends to a side surface of the circuit structure.

In an embodiment, the encapsulant is in contact with the insulating layer.

In an embodiment, the method further includes forming a plurality of conductive elements on the conductive posts.

In an embodiment, the method further comprises disposing an electronic component on the conductive posts.

According to the present disclosure, the conductive posts are directly formed on the circuit structure and encapsulated by the insulating layer. Therefore, the present disclosure dispenses with the conventional TSVs and is capable of fabricating conductive posts of various sizes according to different aspect ratio requirements so as to make end products lighter, thinner, shorter and smaller, thereby increasing the product yield and saving expenses on chemicals.

Further, by replacing the conventional silicon interposer with the insulating layer and using the conductive posts as a signal transmission medium between the electronic element and a circuit board, the present disclosure simplifies the fabrication process and reduces the fabrication cost.

Furthermore, by dispensing with the conventional silicon interposer, the present disclosure avoids warping of the silicon interposer caused by heating.

In addition, the present disclosure allows an electronic element having a high I/O function to be directly disposed on the circuit structure and therefore eliminates the need of a packaging substrate having a core layer and a silicon interposer having TSVs as in the prior art, thereby reducing the thickness of the electronic package.

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 2A to 2G are schematic cross-sectional views showing a method for fabricating an electronic package 2 according to an embodiment of the present disclosure.

Figure 1:
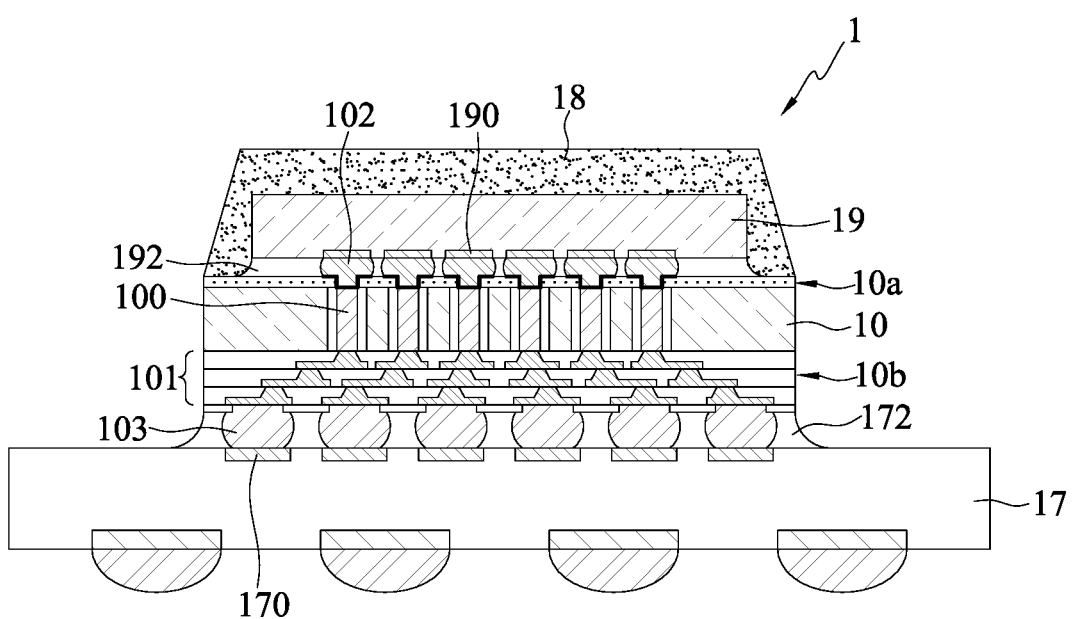
FIG. 1 is a schematic cross-sectional view of a conventional semiconductor package.
Figure 2A:
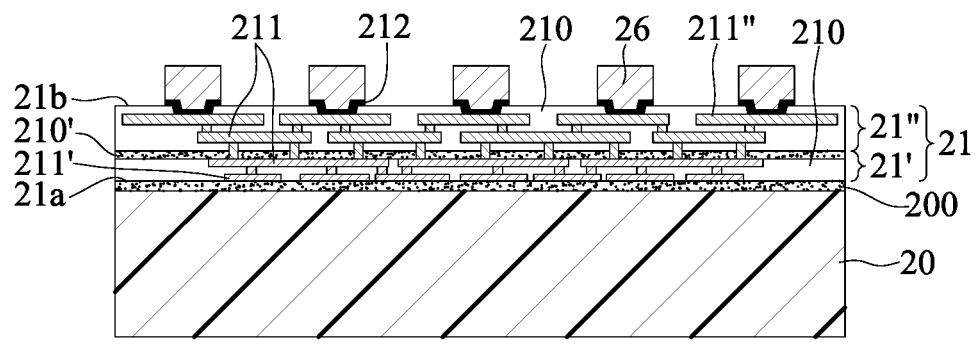
FIGS. 2A to 2G are schematic cross-sectional views showing a method for fabricating an electronic package according to an embodiment of the present disclosure.

Referring to FIG. 2A, a carrier 20 having a separation layer 200 is provided; a circuit structure 21 is then provided on the separation layer 200 of the carrier 20; and, subsequently, a plurality of conductive posts 26 are disposed on the circuit structure 21.

In an embodiment, the carrier 20 is a semiconductor substrate, such as a dummy silicon wafer, a glass substrate or a polymer substrate, and the separation layer 200 is a thermal $SiO_2$ layer, an adhesive layer or, preferably, an organic adhesive layer.

The circuit structure 21 is provided through a redistribution layer (RDL) process. The circuit structure 21 has a first surface 21a bonded to the separation layer 200 and a second surface 21b opposite to the first surface 21a.

In an embodiment, the circuit structure 21 has a plurality of dielectric layers 210, a plurality of internal circuit layers 211 formed in the dielectric layers 210, a first circuit layer 211' formed on the dielectric layer 210 of the first surface 21a, and a second circuit layer 211" formed on the dielectric layer 210 of the second surface 21b. The minimum trace width of the first circuit layer 211' is less than the minimum trace width of the second circuit layer 211". Further, an under bump metallurgy (UBM) layer 212 is formed on the second circuit layer 211" for being bonded to the conductive posts 26.

In consideration of the trace width variation of circuits, in an embodiment the circuit layers having a small trace width (for example, 0.7 um) are formed on the carrier 20 first, then the circuit layers having a medium trace width (for example, 5 um) are formed, and, subsequently, the circuit layers having a large trace width (for example, 10 um) are formed, and so on. In such a way, the circuit layers having a smaller trace width and the dielectric layer thereon have a preferred evenness so as to meet the requirement for forming the circuit layers having a larger trace width. Otherwise, if the circuit layers having a larger trace width are formed before the circuit layers having a smaller trace width, the circuit layers having a larger trace width cannot provide a sufficient evenness for forming the circuit layers having a smaller trace width.

Preferably, if the trace width is less than or equal to 1 um, a first circuit portion 21' (including an insulating separation layer 210') is formed through a wafer process first, and then a back-end packaging process is performed for forming a second circuit portion 21". As such, the circuit structure 21 has the first circuit portion 21' bonded to the separation layer 200 and the second circuit portion 21" stacked on the first circuit portion 21'.

It should be noted that it is not necessary that the first circuit portion 21' has to be manufactured by the wafer process (for example, if the trace width is greater than or equal to 1 um). Since a high-cost chemical vapor deposition (CVD) process is required in the wafer process to form dielectric layers made of silicon nitride or silicon oxide, a general non-wafer process can be performed. That is, a low-cost polymer dielectric layer made of such as polyimide or polybenzoxazole (PBO) is formed by coating for insulation between circuits.

Further, to form the conductive posts 26, a patterning process (for example, metal electroplating, metal deposition or metal etching) is performed to form metal posts such as copper posts on the second surface 21b of the circuit structure 21.

Figure 2B:
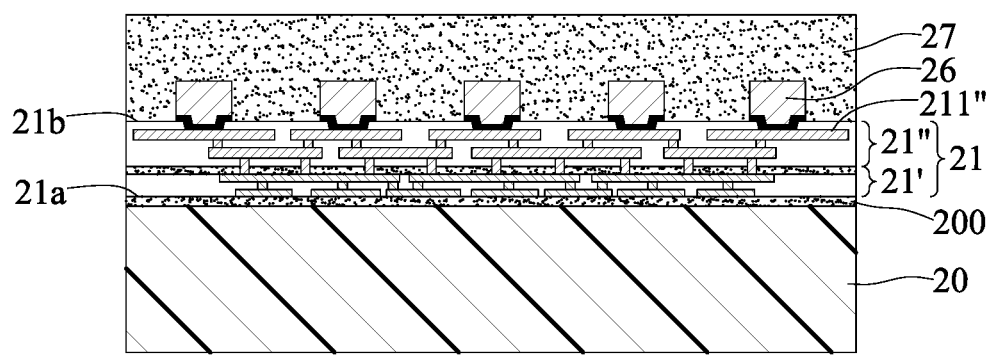

Referring to FIG. 2B, an insulating layer 27 is formed on the second surface 21b of the circuit structure 21 to encapsulate the conductive posts 26.

In an embodiment, the insulating layer 27 is made of polyimide, a dry film, an epoxy resin or a molding compound.

Figure 2C:
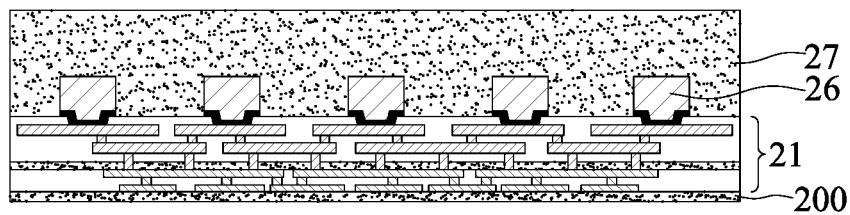

Referring to FIG. 2C, the carrier 20 is removed, leaving the separation layer 200 on the circuit structure 21.

In an embodiment, the carrier 20 is a silicon wafer, and a large portion of the carrier 20 is removed by grinding first, and then the remaining portion of the carrier 20 is removed by etching. The separation layer 200 remains and serves as an etch stop layer. If the carrier 20 is a glass substrate, the separation layer 200 has its adhesive strength degraded through heating or light radiation (such as UV radiation). As such, the carrier 20 is removed, and the separation layer 200 remains and serves as an adhesive layer.

Figure 2D:
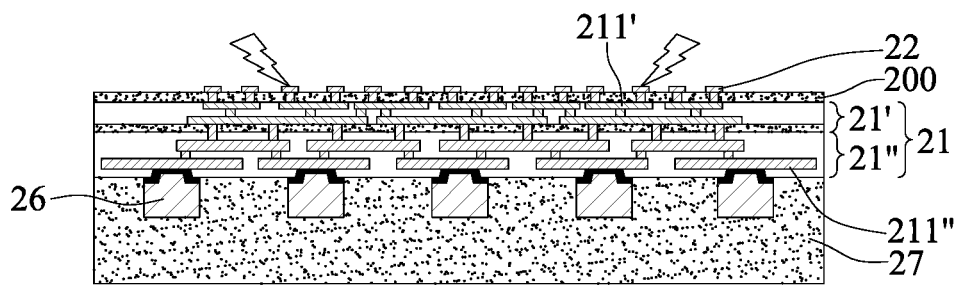

Referring to FIG. 2D, a metal layer 22 is formed on the separation layer 200 and electrically connected to the first circuit layer 211' of the circuit structure 21. Then, an electrical test is optionally performed on the metal layer 22 and the circuit structure 21.

In an embodiment, the metal layer 22 is formed by electroplating, for example, and a conductive layer (not shown) is pre-formed on the separation layer 200 to serve as a current conductive path. The metal layer 22 is a patterned circuit layer having a plurality of conductive pads and conductive traces.

After the electrical test is performed and the circuit structure 21 and the metal layer 22 are determined to be functioning properly, known good dies (KGDs), i.e., electronic elements 23, can be disposed, which will be described later. As such, the present disclosure prevents defects of the circuit structure 21 and the metal layer 22 and hence increases the product yield.

Figure 2E:
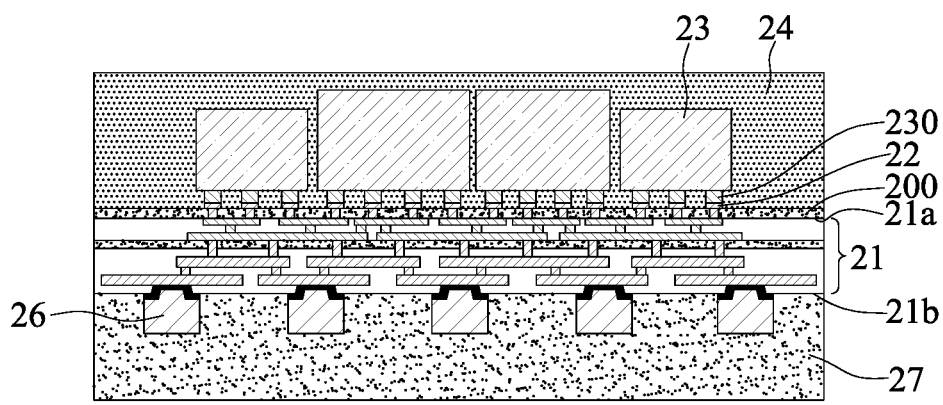

Referring to FIG. 2E, a plurality of electronic elements 23 are disposed on the first surface 21a of the circuit structure 21. Then, an encapsulant 24 is formed on the first surface 21a of the circuit structure 21 to encapsulate the electronic elements 23.

In an embodiment, each of the electronic elements 23 is an active element such as a semiconductor chip, a passive element such as a resistor, a capacitor or an inductor, or a combination thereof.

The electronic elements 23 are electrically connected to the circuit structure 21 in a flip-chip manner. In an embodiment, the electronic elements 23 are electrically connected to the metal layer 22 through a plurality of solder bumps 230. In another embodiment, the electronic elements 23 can be electrically connected to the metal layer 22 through wire bonding.

The encapsulant 24 can be made of polyimide, a dry film, an epoxy resin or a molding compound. The encapsulant 24 and the insulating layer 27 can be made of the same or different materials.

Figure 2F:
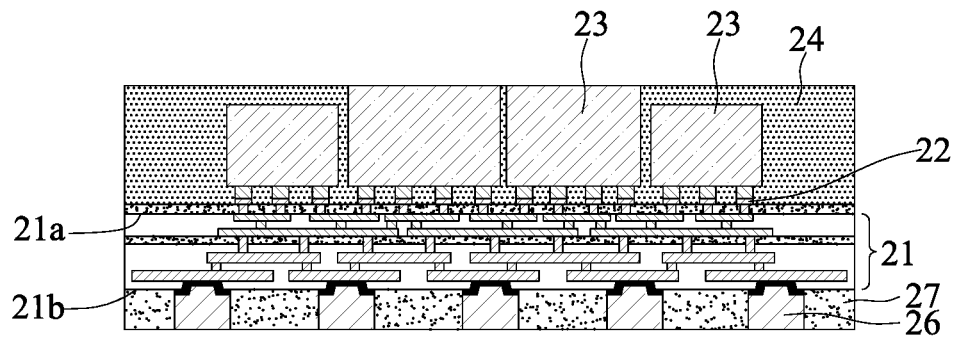

Referring to FIG. 2F, a portion of the insulating layer 27 is removed to expose a portion of a surface of the conductive posts 26.

In an embodiment, a leveling process such as grinding is performed on the insulating layer 27 so as to cause the exposed surfaces of the conductive posts 26 to be flush with the surface of the insulating layer 27. In another embodiment, an opening process is performed on the insulating layer 27 so as to expose the surface of the conductive posts 26 through a plurality of openings of the insulating layer 27.

A leveling process or an opening process can further be performed on the encapsulant 24 so as to expose a portion of a surface of the electronic elements 23 from the surface of the encapsulant 24.

As a whole, the metal layer 22, the conductive posts 26, the insulating layer 27 and the circuit structure 21 can be viewed as a packaging substrate.

Figure 2G:
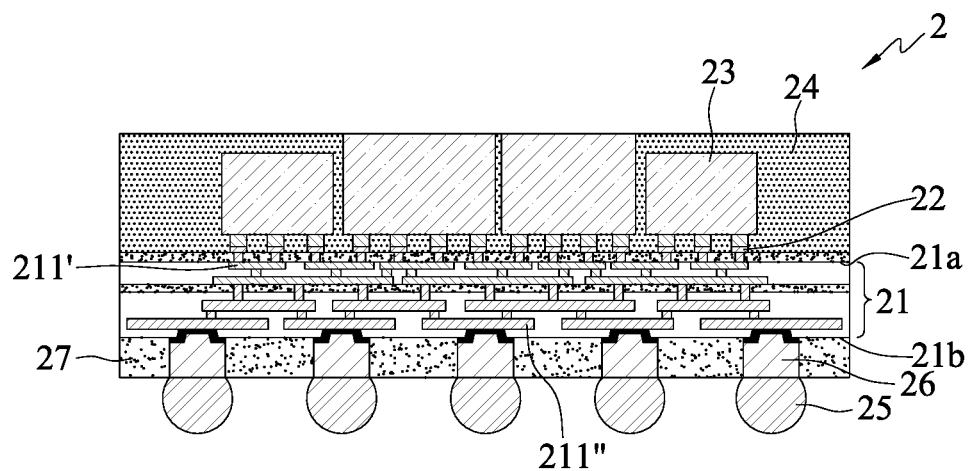

Referring to FIG. 2G, a plurality of conductive elements 25 are disposed on the conductive posts 26.

In an embodiment, the conductive elements 25 are solder balls, metal bumps or metal pins, which are bonded to the conductive posts 26 so as to be electrically connected to the second circuit layer 211".

Figure 2H:
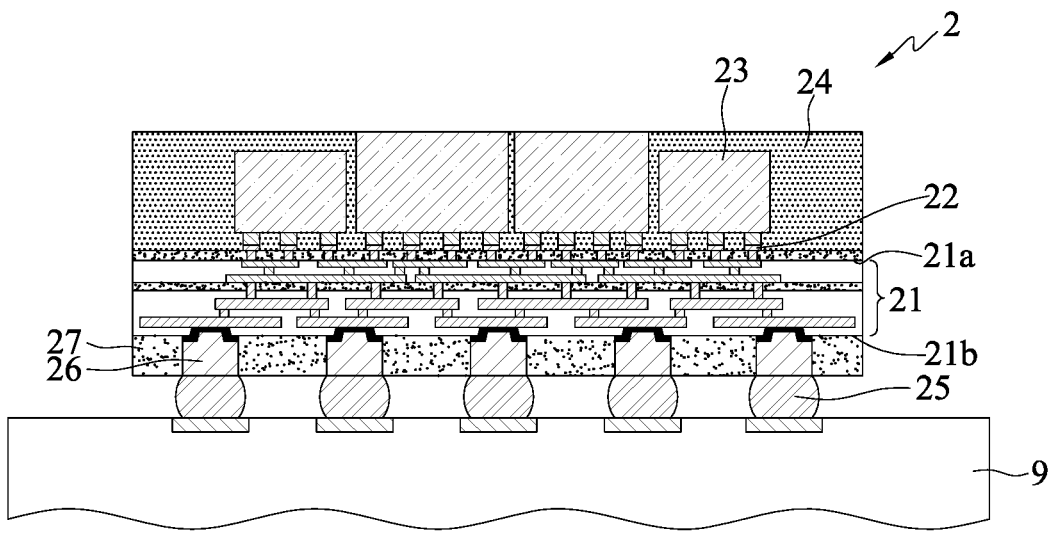
FIG. 2H is a schematic cross-sectional view showing a subsequent application of the electronic package according to the present disclosure.

The second surface 21b of the circuit structure 21, the second circuit layer 211" and the conductive posts 26 serve as a ball mounting side, and the electronic package 2 can be electrically connected to a circuit board 9 (as shown in FIG. 2H) through the conductive elements 25. As such, the present disclosure dispenses with the conventional silicon interposer and thereby reduces the fabrication cost and the overall thickness of end products.

Figure 3A:
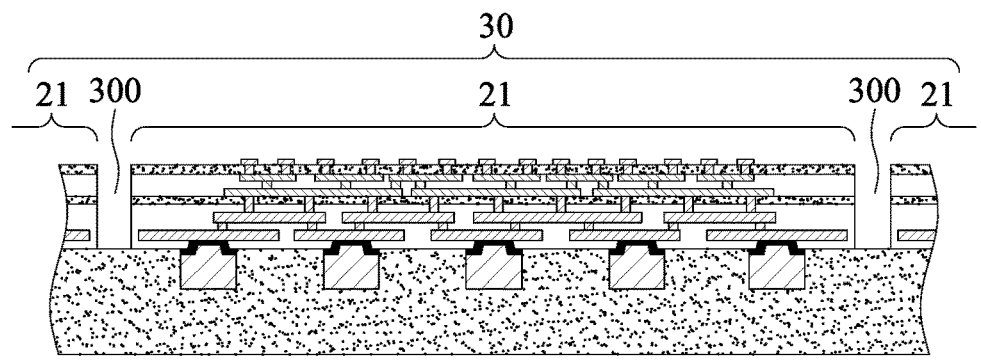
FIGS. 3A to 3C are schematic cross-sectional views showing a method for fabricating an electronic package according to another embodiment of the present disclosure.
Figure 3B:
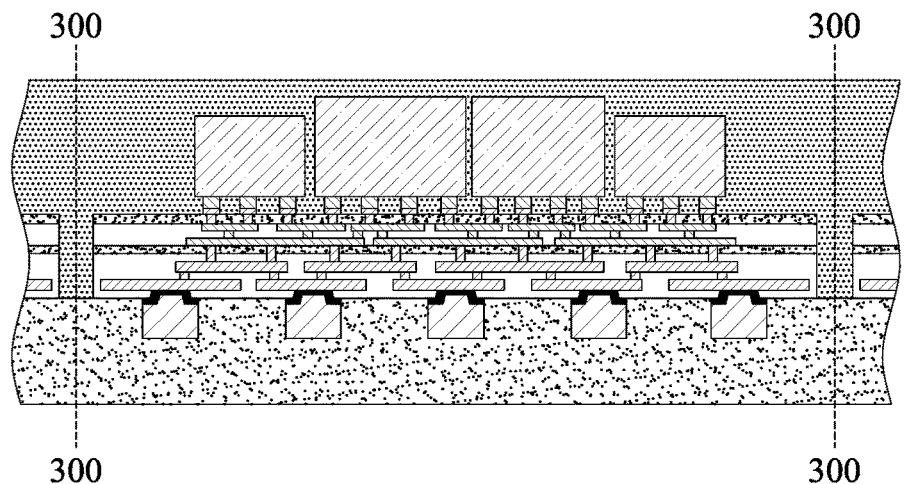
Figure 3C:
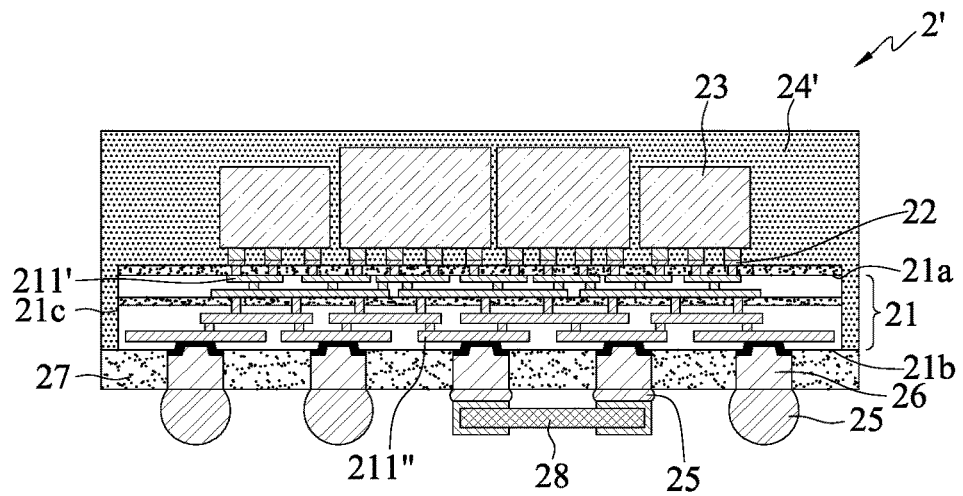

FIGS. 3A to 3C are schematic cross-sectional views showing a method for fabricating an electronic package 2' according to another embodiment of the present disclosure. Referring to the electronic package 2' of FIG. 3C, the encapsulant 24' extends to a side surface 21c of the circuit structure 21 and comes into contact with the insulating layer 27. Therefore, the encapsulant 24' and the insulating layer 27 encapsulate the entire circuit structure 21. In an embodiment, as shown in FIG. 3A, followed by FIG. 2D, a full-panel substrate 30 consisting of a plurality of circuit structures 21 is provided, and a die saw process is performed to form a plurality of cutting paths 300 on the first surfaces 21a of the circuit structures 21. Since the cutting paths 300 are positioned at peripheries of the circuit structures 21, the die saw process also removes the edges of the circuit structures 21, with the insulating layer 27 remained, however. Subsequently, referring to FIG. 3B, the process of FIG. 2E is performed and the encapsulant 24' is filled in the cutting paths 300 to encapsulate the side surfaces 21c of the circuit structures 21. Finally, a singulation process is performed along the cutting paths 300 to obtain the electronic package 2' of FIG. 3C.

Further, referring to FIG. 3C, at least one electronic component 28 can be disposed on the conductive posts 26 through the conductive elements 25. In an embodiment, the electronic component 28 is an active element such as a semiconductor chip, a passive element such as a resistor, a capacitor or an inductor, or a combination thereof. Referring to FIG. 3C, the electronic component 28 is a passive element. The electronic package 2' is formed with the first circuit layer 211' and the second circuit layer 211", and electronic components can be disposed on both upper and lower sides of the electronic package 2' so as to improve the electrical performance of the electronic package 2'.

It should be understood that a full-panel substrate consisting of a plurality of circuit structures 21 can be provided in the process of FIG. 2A, and a singulation process can be performed after formation of the conductive elements 25 so as to obtain the electronic package 2, 2' of FIGS. 2G and 3C.

According to the present disclosure, the conductive posts 26 are directly formed on the circuit structure 21 and encapsulated by the insulating layer 27. Therefore, the present disclosure dispenses with the conventional TSVs and is capable of fabricating conductive posts 26 of various sizes according to different aspect ratio requirements (for example, a small aspect ratio) so as to make end products lighter, thinner, shorter and smaller, thereby increasing the product yield and saving expenses on chemicals.

Further, by replacing the conventional silicon interposer with the insulating layer 27 and using the conductive posts 26 as a signal transmission medium between the electronic elements 23 and the circuit board 9, the present disclosure simplifies the fabrication process and reduces the fabrication cost.

Furthermore, by dispensing with the conventional silicon interposer, the present disclosure avoids warping of the silicon interposer caused by heating.

In addition, the present disclosure allows the electronic elements 23 having high I/O functions to be directly disposed on the first circuit layer 211' of the circuit structure 21 and therefore eliminates the need of a packaging substrate having a core layer and a silicon interposer having TSVs as in the prior art, thus reducing the thickness of the electronic package 2, 2'.

The present disclosure further provides an electronic package 2, 2', which has: a circuit structure 21 having a first surface 21a provided with a first circuit layer 211' and an opposite second surface 21b provided with a second circuit layer 211"; a metal layer 22 formed on the first surface 21a of the circuit structure 21 and electrically connected to the first circuit layer 211'; a plurality of electronic elements 23 disposed on the first surface 21a of the circuit structure 21 and electrically connected to the metal layer 22; an encapsulant 24, 24' formed on the first surface 21a of the circuit structure 21 and encapsulating the electronic elements 23; a plurality of conductive posts 26 formed on the second surface 21b of the circuit structure 21 and electrically connected to the second circuit layer 211"; and an insulating layer 27 formed on the second surface 21b of the circuit structure 21 and encapsulating the conductive posts 26, wherein a portion of a surface of the conductive posts 26 is exposed from the insulating layer 27.

In an embodiment, the first circuit layer 211' has a minimum trace width less than that of the second circuit layer 211".

In an embodiment, the metal layer 22 is a patterned circuit layer.

In an embodiment, the encapsulant 24, 24' and the insulating layer 27 are made of the same material.

In an embodiment, the encapsulant 24, 24' and the insulating layer 27 are made of different materials.

In an embodiment, the encapsulant 24' is in contact with the insulating layer 27.

In an embodiment, the electronic package 2 further comprises a plurality of conductive elements 25 disposed on the conductive posts 26.

In an embodiment, the electronic package 2' further comprises at least one electronic component 28 disposed on the conductive posts 26.

According to the present disclosure, the conductive posts are directly formed on the circuit structure and encapsulated by the insulating layer. Therefore, the present disclosure dispenses with the conventional TSVs and is capable of fabricating conductive posts having smaller aspect ratios so as to make end products lighter, thinner, shorter and smaller, thereby increasing the product yield and saving expenses on chemicals.

Further, by replacing the conventional silicon interposer with the insulating layer and using the conductive posts as a signal transmission medium between the electronic elements and a circuit board, the present disclosure simplifies the fabrication process and reduces the fabrication cost.

Furthermore, by dispensing with the conventional silicon interposer, the present disclosure avoids warping of the silicon interposer caused by heating.

In addition, the present disclosure allows electronic elements having high I/O functions to be directly disposed on the circuit structure and therefore eliminates the need of a packaging substrate having a core layer and a silicon interposer having TSVs as in the prior art, thus reducing the thickness of the electronic package.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
    a circuit structure having a first surface provided with a first circuit layer and an opposite second surface provided with a second circuit layer;
    a metal layer formed on the first surface of the circuit structure and electrically connected to the first circuit layer;
    an electronic element disposed on the first surface of the circuit structure and electrically connected to the metal layer;
    an encapsulant formed on the first surface of the circuit structure and encapsulating the electronic element;
    a plurality of conductive posts disposed on the second surface of the circuit structure and electrically connected to the second circuit layer; and
    an insulating layer formed on the second surface of the circuit structure and encapsulating the conductive posts,
    wherein a portion of a surface of each of the conductive posts is exposed from the insulating layer; wherein the encapsulant is in contact with the insulating layer.

2. The electronic package of claim 1, wherein the first circuit layer has a minimum trace width less than a minimum trace width of the second circuit layer.

3. The electronic package of claim 1, wherein the metal layer is a patterned circuit layer.

4. The electronic package of claim 1, wherein the encapsulant and the insulating layer are made of the same material.

5. The electronic package of claim 1, wherein the encapsulant and the insulating layer are made of different materials.

6. The electronic package of claim 1, wherein the encapsulant extends to a side surface of the circuit structure.

7. The electronic package of claim 1, further comprising a plurality of conductive elements disposed on the conductive posts.

8. The electronic package of claim 1, further comprising an electronic component disposed on the conductive posts.

* * * * *